(12) United States Patent
Park (10) Patent No.: US 10,638,626 B1
(45) Date of Patent: Apr. 28, 2020

(54) FOLDABLE DESKTOP ELECTRONIC MAGNIFIER

(71) Applicant: C&P CO., LTD., Busan (KR)

(72) Inventor: Kyeong Min Park, Seoul (KR)

(73) Assignee: C&P CO., LTD., Busan (KR)

( * ) Notice: Subject to any disclaimer, the term of this patent is extended or adjusted under 35 U.S.C. 154(b) by 0 days.

(21) Appl. No.: 16/212,978

(22) Filed: Dec. 7, 2018

(30) Foreign Application Priority Data

Nov. 30, 2018 (KR) ........................ 10-2018-0152364

(51) Int. Cl.
| | |
|---|---|
| *G03B 17/56* | (2006.01) |
| *H05K 5/02* | (2006.01) |
| *H05K 5/00* | (2006.01) |
| *G09B 21/00* | (2006.01) |
| *H04N 5/262* | (2006.01) |

(52) U.S. Cl.
CPC ......... *H05K 5/0226* (2013.01); *G03B 17/561* (2013.01); *G09B 21/008* (2013.01); *H05K 5/0017* (2013.01); *H05K 5/0234* (2013.01); *H04N 5/2628* (2013.01)

(58) Field of Classification Search
CPC ............................. G09B 21/008; G02B 21/008
See application file for complete search history.

(56) References Cited

U.S. PATENT DOCUMENTS

| | | | | |
|---|---|---|---|---|
| 2006/0158427 A1* | 7/2006 | Goldenberg | ......... | G02B 27/026 345/156 |
| 2009/0296162 A1* | 12/2009 | Van Schaik | .......... | G09B 21/001 358/401 |
| 2011/0141256 A1* | 6/2011 | Rodriguez | ........... | G02B 27/026 348/63 |
| 2012/0075454 A1* | 3/2012 | Sugiyama | ............ | G02B 27/022 348/79 |
| 2012/0230668 A1* | 9/2012 | Vogt | ..................... | G03B 17/561 396/428 |

* cited by examiner

*Primary Examiner* — Clayton E. LaBalle
*Assistant Examiner* — Dennis Hancock
(74) *Attorney, Agent, or Firm* — Bayramoglu Law Offices LLC (57) ABSTRACT

A foldable desktop electronic magnifier for helping a low vision person view text or images by magnifying the text or images and providing the magnified text or images through a monitor. The foldable desktop electronic magnifier is easy to carry for use in a workplace, a school, a home, and the like and is provided on a desk or table. The foldable desktop electronic magnifier includes: a support plate entirely supporting the magnifier; a horizontal link arm secured to the support plate; a first vertical link arm rotatably coupled to the first horizontal link arm; a camera supporting part rotatably coupled to the first vertical link arm and having a camera mounted therein; a second vertical link arm rotatably coupled to the first vertical link arm; and a monitor rotatably secured to the second vertical link arm.

8 Claims, 7 Drawing Sheets

FOLDABLE DESKTOP ELECTRONIC MAGNIFIER

CROSS REFERENCE TO THE RELATED APPLICATION

The present application claims priority to Korean Patent Application No. 10-2018-0152364, filed Nov. 30, 2018, the entire content of which is incorporated herein by reference.

TECHNICAL FIELD

The present invention relates generally to a foldable desktop electronic magnifier having a foldable structure so as to be convenient for a user to carry. More particularly, the present invention relates to a foldable desktop electronic magnifier for helping low vision people view documents or objects for work tasks, rehabilitation, and leisure by magnifying the documents or objects and providing the magnified documents or objects through a monitor.

BACKGROUND

In general, among the elderly who due to aging need visual aids to perform activities such as work, leisure, reading of documents, and among the visually impaired who are not totally blind there is a low vision person. The "low vision person" is a comprehensive concept describing a person who has the ability to see but needs to supplement low vision through an aid, a magnifying glass, and the like.

Currently, a magnifying glass or an electronic magnifier is used as an optical aid for helping such a low vision person read documents and perform home and work tasks. The magnifying glass is easy to carry and is equipped with a lamp, thus making it possible to read text regardless of place, but is disadvantageous in that the higher the magnification, the narrower the field of view and the shorter the focal distance, thus causing eye fatigue, and a high resolution of Full HD or higher is not provided. On the other hand, the electronic magnifier has a wide field of view and a long focal distance thus enabling a user to easily to read documents, provides a clear image with a high resolution of Full HD or higher, and has a self-view function that allows the user to identify his/her face to check a health condition. Furthermore, the electronic magnifier has a remote viewing function thus being very convenient for remotely viewing objects up without a telescope.

The electronic magnifier is generally divided into portable and desktop type. A portable electronic magnifier is a small electronic magnifier which is convenient for a low vision person to carry and has a monitor of equal to or less than about 10 inches. A desktop electronic magnifier is a large electronic magnifier which is used on a desk or a table and is more functional and better to use, but is inconvenient to carry.

A typical desktop electronic magnifier according to the related art is a stationary type and thus may be inconvenient to carry. Even if a folding function is provided, the electronic magnifier may be rotated rapidly upon folding, causing a problem in that a student or an elderly person using the electronic expander is injured, or damage to the magnifier occurs. Furthermore, a camera may be rotated rapidly upon rotation, making it difficult for a user to adjust an optimum position of an object to be magnified and to avoid the influence of light when checking an object and a document which are made of a shiny material.

The foregoing is intended merely to aid in the understanding of the background of the present invention, and is not intended to mean that the present invention falls within the purview of the related art that is already known to those skilled in the art.

SUMMARY

Accordingly, the present invention has been made keeping in mind the above problems occurring in the related art, and an objective of the present invention is to provide a foldable desktop electronic magnifier configured to be folded and unfolded, the magnifier being convenient to carry while including the advantages of a typical desktop magnifier, the magnifier having a monitor positioned to be parallel to a support plate upon folding, thus achieving a significant reduction in volume.

Another objective of the present invention is to provide a foldable desktop electronic magnifier, which is capable of restricting rotation of a camera by means of a spring and the like to prevent rapid rotation of the camera and adjusting the angle of the camera precisely to match an optimum position of an object, while being prevented from being damaged due to a collision between a support plate and a vertical link arm that occurs when the vertical link arm is rotated rapidly upon folding so as to prevent a user from being injured.

The objectives of the present invention are not limited to the above-mentioned objective, and further objectives not described above will be clearly understood from the description described below by those skilled in the art.

In order to achieve the above objective, according to one aspect of the present invention, there is provided a foldable desktop electronic magnifier, including: a support plate entirely supporting the magnifier; a horizontal link arm secured to the support plate; a first vertical link arm rotatably coupled to the first horizontal link arm; a camera supporting part rotatably coupled to the first vertical link arm and having a camera mounted therein; a second vertical link arm rotatably coupled to the first vertical link arm; and a monitor rotatably secured to the second vertical link arm, wherein the first vertical link arm is rotated with respect to the first horizontal link arm, the second vertical link arm is rotated with respect to the first vertical link arm, and the monitor is rotated with respect to the second vertical link arm, whereby the monitor is folded in contact with the support plate.

According to an exemplary embodiment of the present invention, the camera supporting part may include: a securing body secured to a first side of the first vertical link arm; a body cap coupled to the securing body; a cam spring secured to the body cap; a cam lever provided at an outside of the body cap; a camera casing having the camera mounted therein in a secured manner; a rotary bracket inserted into the camera casing and being rotatable in cooperation with operation of the cam lever; and a cam lever shaft passing through an insertion hole of the cam lever, an insertion hole of the body cap, the cam spring, and an insertion hole of the securing body, whereby a tip of the cam lever shaft is inserted into an insertion hole of the rotary bracket.

According to an exemplary embodiment of the present invention, the cam lever shaft may have a semicircular cross section, the insertion hole of the cam lever may have a semicircular cross section so as to correspond to a shape of the cam lever shaft, and the cam lever shaft may be rotated in cooperation with rotation of the cam lever.

According to an exemplary embodiment of the present invention, the cam lever shaft may be inserted into the cam spring, and the cam spring may have two horizontal lines parallel to each other, the cam spring elastically supporting rotation of the cam lever shaft such that the cam lever shaft being rotated is stopped at a predetermined rotation angle.

According to an exemplary embodiment of the present invention, the foldable desktop electronic magnifier may further include: a main arm rotation part provided at a second side of the first vertical link arm, wherein the main arm rotation part may include: a securing bracket secured to the support plate; a nut provided on a side surface of the securing bracket; a joint bracket secured to the first vertical link arm; a guide plate inserted into a guide hole formed in an upper portion of the joint bracket and configured to be movable upward and downward; a tension spring having one end secured to the first vertical link arm and the other end secured to the guide plate and pulling the guide plate with a predetermined force; a cam being in close contact with a lower horizontal plate of the guide plate; and an arm shaft passing through the cam, the guide plate, the joint bracket, and the securing bracket, whereby a tip of the arm shaft is coupled to the nut.

According to an exemplary embodiment of the present invention, the arm shaft may have a circular cross section having a flat surface formed at upper and lower portions thereof, and an insertion hole of the cam and an insertion hole of the securing bracket may have a circular cross section having a flat surface so as to correspond to a shape of the arm shaft.

According to an exemplary embodiment of the present invention, when the first vertical link arm is rotated with respect to the securing bracket, the guide plate may be elastically supported by the tension spring, and the lower horizontal plate of the guide plate may be rotated in close contact with an outer peripheral surface of the cam.

According to an exemplary embodiment of the present invention, the securing bracket may have a protruding step, and the first vertical link arm may have a guide groove formed in a lower portion thereof, whereby a rotation range of the first vertical link arm may be restricted by the protruding step of the securing bracket.

As described above, according to the foldable desktop electronic magnifier according to the present invention, the monitor can be folded and unfolded to be parallel to the base plate, thus achieving a significant reduction in volume upon folding, and the magnifier can be convenient to carry, thus being excellent in portability.

Furthermore, according to the present invention, the cam lever shaft of the camera supporting part is elastically supported by the cam spring, thus preventing the camera supporting part from being rotated rapidly, and the angle of the camera can be precisely adjusted.

Furthermore, the guide plate is elastically supported by the tension spring of the main arm rotation part, thus preventing the vertical link arm from being rotated rapidly. This makes it possible to prevent a student or an elderly person using the electronic magnifier from being injured due to rapid rotation while preventing damage to the magnifier.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE EMBODIMENTS

The above and other objectives, features and advantages of the present invention will be more clearly understood from the following detailed description when taken in conjunction with the accompanying drawings. Embodiments of the present invention are presented to make complete disclosure of the present invention and help those who are ordinarily skilled in the art best understand the invention. Various changes to the following embodiments are possible and the scope of the present invention is not limited to the following embodiments. In addition, the scope of the present invention is defined only by the accompanying claims and their equivalents if appropriate.

Reference will now be made in greater detail to exemplary embodiments of the present invention, examples of which are illustrated in the accompanying drawings. Throughout the drawings, the same reference numerals will refer to the same or like parts. The term "and/or" is interpreted to include each of enumerated items, and all combinations including one or more items selected from among the enumerated items.

It will be understood that, although the terms first, second, etc. may be used herein to describe various elements, these elements should not be limited by these terms. These terms are only used to distinguish one element, from another element. Therefore, a first element discussed below could be termed a second element without departing from the teachings of the present invention.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises", "comprising", "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

Hereinbelow, exemplary embodiments of the present invention will be described in detail with reference to the accompanying drawings.

Figure 1:
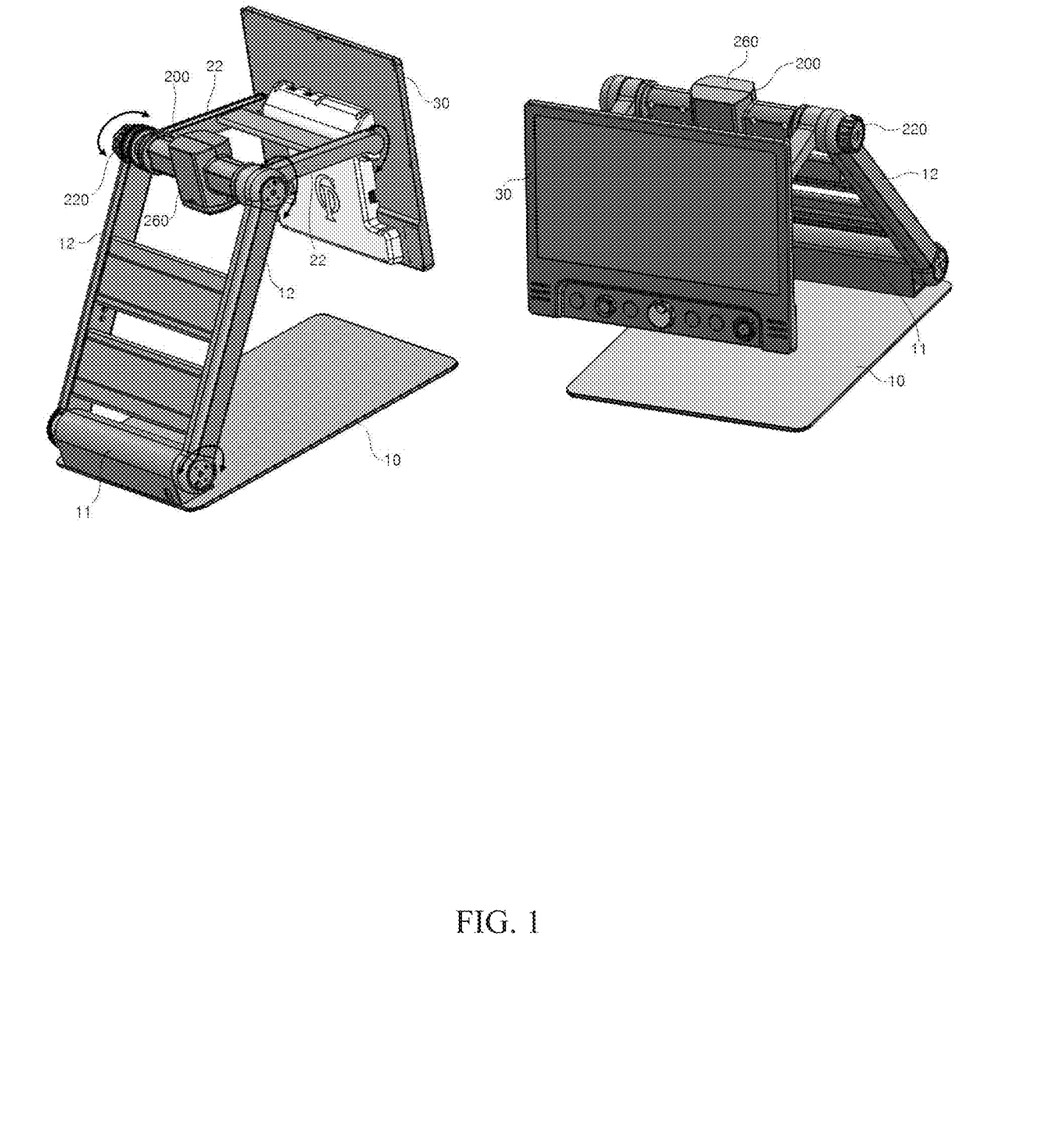
FIG. 1 is a perspective view showing a foldable desktop electronic magnifier according to an embodiment of the present invention.

FIG. 1 is a perspective view showing a foldable desktop electronic magnifier according to an embodiment of the present invention.

Referring to FIG. 1, the foldable desktop electronic magnifier according to the present invention includes a support plate 10, a first horizontal link arm 11, a first vertical link arm 12, a camera supporting part 200, a second vertical link arm 22, and a monitor 30.

The support plate 10 is a part which is placed on a desk or table and has a flat planar shape. As shown in the drawings, it is preferable that the support plate 10 has a quadrangle shape, but is not limited thereto. The support plate 10 serves to entirely support the electronic magnifier.

The first horizontal link arm 11 is a part which is horizontally secured to the support plate 10 and corresponds to the central axis of the first vertical link arm 12. The first vertical link arm 12 is rotatable with respect to the first horizontal link arm 11.

The first vertical link arm 12 is rotatably coupled to the first horizontal link arm 11 and is provided at each end of the first horizontal link arm 11 to be form a pair of two first vertical link arms 12. The first vertical link arms 12 have at least one support interposedly connected therebetween. The support serves to maintain distance between the first vertical link arms 12 and support the first vertical link arms 12.

The camera supporting part 200 is rotatably provided at first sides of the first vertical link arms 12. The camera supporting part 20 has a camera provided therein to magnify an object placed on the support plate 10. More precisely, the camera is provided within a camera casing 260 positioned at the center of the camera supporting part 20. A user can directly rotate the camera casing 260 or rotate a cam lever 220 to adjust the capture angle of the camera. When the cam lever 220 is used, the cam lever 220 is rotated whereby the camera supporting part 200 is rotated, and the camera (not shown) is rotated in cooperation with rotation of the camera supporting part 200. The image information captured by the camera is transmitted to a controller connected to the monitor 30.

The second vertical link arm 22 is rotatably coupled to the first vertical link arm 12 and is provided as a pair of two second vertical link arms 22. The second vertical link arms 22 have at least one support interposedly connected therebetween. The support serves to maintain distance between the second vertical link arms 22 and support the second vertical link arms 22.

The monitor 30 is rotatably coupled to the second vertical link arms 22. The monitor 30 has operation buttons provided at a lower portion thereof for selecting magnification increase/decrease, screen color change, screen selection, and the like.

The foldable desktop electronic magnifier according to the present invention is structured to rotate with respect to three axes and be completely foldable. In other words, the first vertical link arms 12 are rotated with respect to the first horizontal link arm 11, the second vertical link arms 22 are rotated with respect to the first vertical link arms 12, and the monitor 30 is rotated with respect to the second vertical link arms 22. As in the present invention, the rotation with respect to three axes makes it possible to freely adjust the angle of the monitor and fold the monitor in contact with the support plate. Thus, the foldable desktop electronic magnifier according to the present invention has the advantages of being completely foldable and movable, thus being convenient to carry and being used in various places such as a school, a workplace, a home, and the like.

The camera supporting part 200 provided horizontally at the first sides of the first vertical link arms 12 will be described below.

Figure 2:
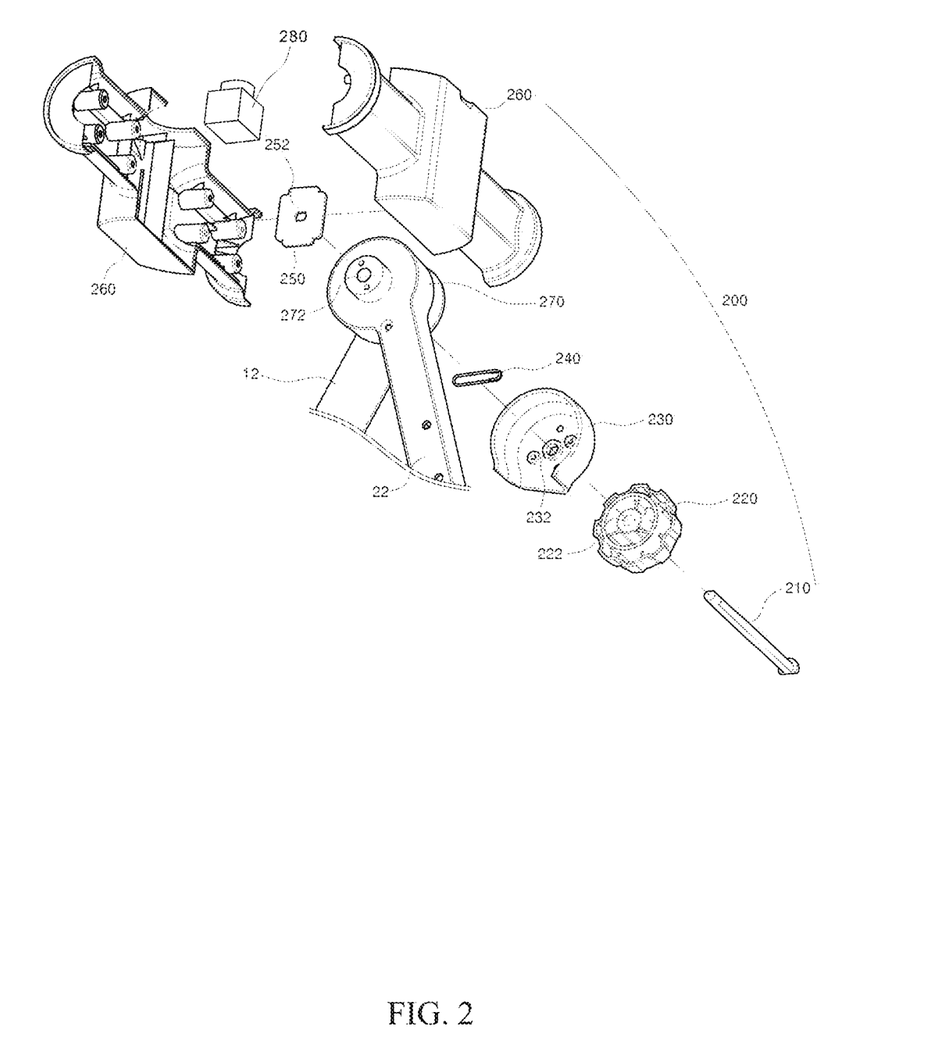
FIG. 2 is an exploded perspective view showing a camera supporting part of the foldable desktop electronic magnifier according to the embodiment of the present invention.

FIG. 2 is an exploded perspective view showing a camera supporting part of the foldable desktop electronic magnifier according to the embodiment of the present invention.

Referring to FIG. 2, the camera supporting part 200 is a part in which the camera 280 for magnifying an object placed on the support plate is mounted. In particular, the camera 280 is mounted within the camera casing 260. The camera supporting part 200 is rotated by rotating the camera casing 260 or rotating the cam lever 220. The image information captured by the camera is transmitted to the controller and displayed on the monitor 30 in a magnified form.

The camera supporting part 200 includes a securing body 270, a body cap 230, a cam spring 240, the cam lever 220, the camera casing 260, a rotary bracket 250, and a cam lever shaft 210.

The securing body 270 is secured to the first side of the first vertical link arm 12, and the body cap 230 is coupled to the securing body 270 in a secured manner. The securing body 270 has an insertion hole 272 formed therein and through which the cam lever shaft 210 passes, and the body cap 230 also has an insertion hole 232 formed therein and through which the cam lever shaft 210 passes.

The cam spring 240 is secured to the inside of the body cap 230. The cam spring 240 is a spring having horizontal lines which are parallel to each other and into which the cam lever shaft 210 is inserted.

The cam lever 220 is provided at the outside of the body cap 230 to be rotatable without being secured to the body cap 230. In other words, the body cap 30 remains fixed in position without being rotated, whereas the cam lever 220 is rotatable by a user's manipulation.

The rotary bracket 250 is a part which is inserted into the camera casing 260 and is rotated in cooperation with rotation of the cam lever 220. In other words, the rotary bracket 250 has an insertion hole 252 formed at the center thereof in a shape corresponding to the shape of the tip of the cam lever shaft 210, whereby when the cam lever 220 is rotated, the rotary bracket 250 is rotated in cooperation with rotation of the cam lever.

The camera casing 260 is a part in which the camera is mounted in a secured manner. When the cam lever 220 is rotated, the rotary bracket 250 is rotated in cooperation with rotation of the cam lever, causing the camera casing 260 to be rotated in cooperation with rotation of the rotary bracket 250. The camera is not shown in the drawings.

The cam lever shaft 210 passes through the insertion hole 220 of the cam lever 220, the insertion hole 232 of the body cap 230, the cam spring 240, and the insertion hole 272 of the securing body 270, whereby the tip of the cam lever shaft 210 is inserted into the insertion hole 252 of the rotary bracket 250.

The body of the cam lever shaft 210 has a semicircular cross section, and the insertion hole 222 of the cam lever 220 also has a semicircular cross section so as to correspond to the shape of the body of the cam lever shaft 210. On the other hand, the insertion hole 232 of the body cap 230 and the insertion hole 272 of the securing body 270 have a circular shape. This is because when the cam lever 220 is rotated, the body cap 230 and the securing body 270 are secured irrespective of rotation of the cam lever 220 while the cam lever shaft 210 is rotated.

The insertion hole 252 of the rotary bracket 250 is a part into which the tip of the cam lever shaft 210 is inserted and has a shape corresponding to the shape of the tip of the cam lever shaft 210. It is preferable that the tip of the cam lever shaft 210 has a flat surface formed on upper and lower surfaces thereof, and the insertion hole 252 of the rotary bracket 250 also has a flat surface formed on upper and lower surfaces thereof so as to correspond thereto.

The securing body 270, the cam spring 240, and the body cap 230 are secured irrespective of rotation of the cam lever 220 and thus are not rotated even when the cam lever 220 is rotated. On the other hand, when the cam lever 220 is rotated, the cam lever shaft 210, the rotary bracket 250, and the camera casing 260 are rotated in cooperation with rotation of the cam lever 220.

In other words, when the user rotates the cam lever 220, the cam lever shaft 210 inserted in the insertion hole 222 of the cam lever 220 is rotated, causing the rotary bracket 250 to which the tip of the cam lever shaft 210 is coupled to be rotated. This causes the camera casing 260 to be rotated in cooperation with rotation of the rotary bracket 250. Since the camera is mounted within the camera casing 260, the camera is rotated in cooperation with rotation of the camera casing 260, thus adjusting the capture angle.

Figure 3A:
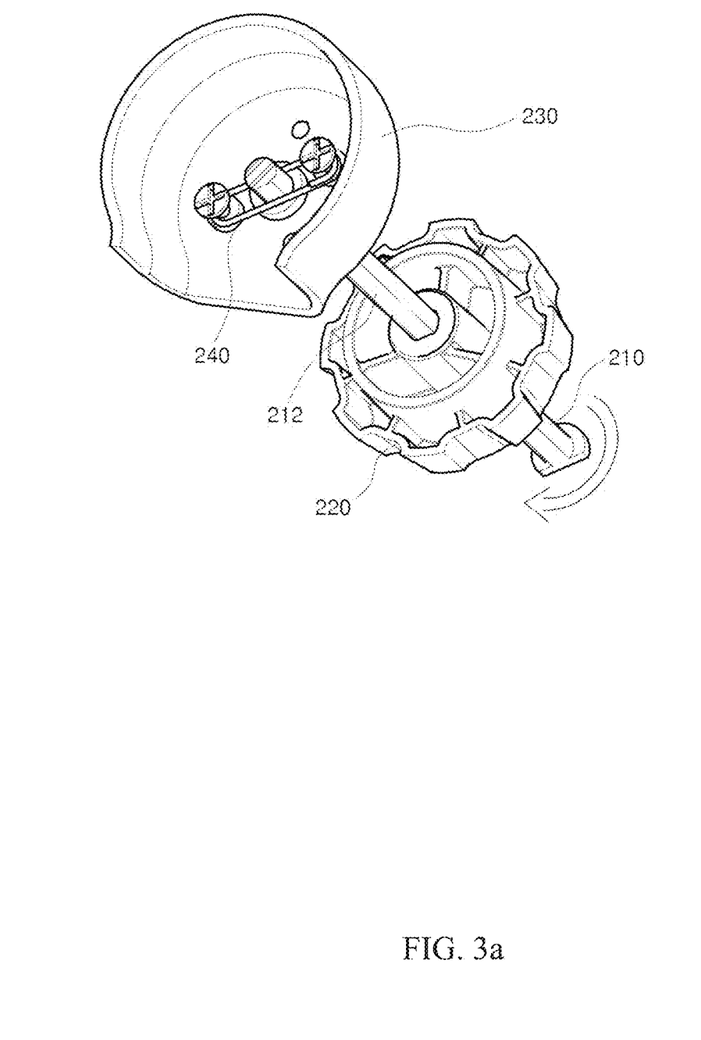
FIGS. 3A and 3B are partially enlarged views of FIG. 2, which show an operating principle of a cam spring.
Figure 3B:
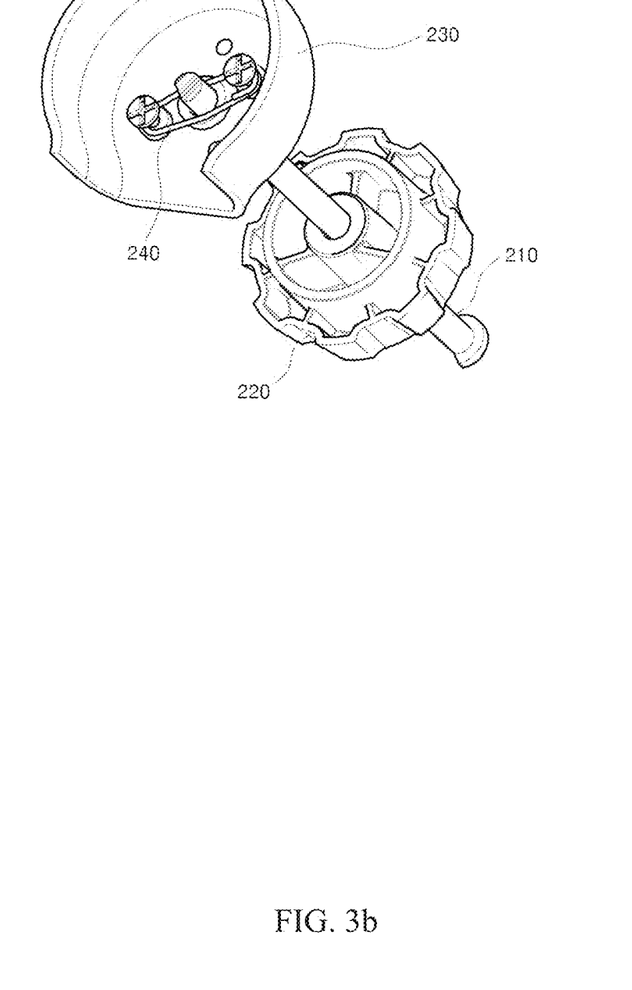

FIGS. 3A and 3B are partially enlarged views of FIG. 2, which show an operating principle of the cam spring.

Referring to FIGS. 3A and 3B, the cam spring 240 secured to the body cap 230 has two horizontal lines parallel to each other and provides an elastic supporting force to the cam lever shaft 210 inserted therein. The cam spring 240 is made of wire.

The cam lever shaft 210 has a semicircular cross section and a flat surface 212 formed in a longitudinal direction thereof.

FIG. 3A shows a state where the flat surface 212 of the cam lever shaft 210 is parallel to the horizontal lines of the cam spring 240, while FIG. 3B shows a state where the flat surface 212 of the cam lever shaft 210 is perpendicular to the horizontal lines of the cam spring 240.

As shown in FIGS. 3A and 3B, when the cam lever shaft 210 having a semicircular cross section is rotated, the cam spring 240 causes the cam lever shaft 210 being rotated to be stopped at a predetermined rotation angle. In other words, when the cam lever 220 is rotated, the cam lever shaft 210 is rotated in cooperation with rotation of the cam lever. Herein, since the cam lever shaft 210 is inserted in the cam spring 240, the cam lever shaft 210 is elastically supported between two horizontal lines of the cam spring 240. The cam lever shaft 210 being rotated is stopped at the predetermined rotation angle by the cam spring 240. Thus, the camera casing is not rotated easily at the predetermined rotation angle but is stopped, and the camera casing is rotated only when the user rotates the cam lever with a stronger force. As described above, the cam lever shaft having a semicircular cross section is provided and the cam lever shaft is inserted into the cam spring having two horizontal lines, whereby it is possible to impart an elastic force to rotation of the cam lever shaft, thus preventing the camera casing (that is, the camera supporting part) from being rotated rapidly.

Next, a main arm rotation part 300 provided at a second side of the first vertical link arm 12 will be described below.

Figure 4:
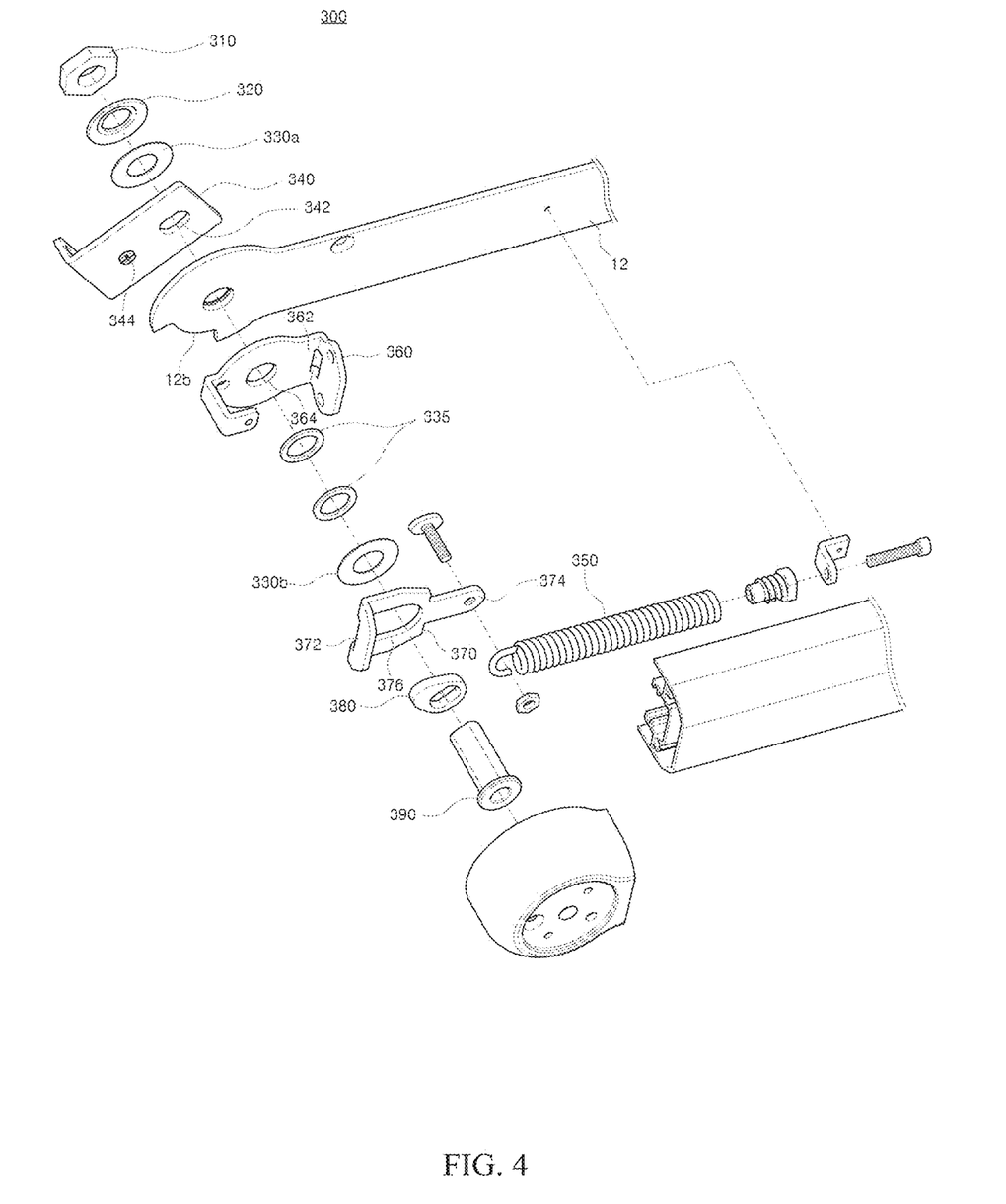
FIG. 4 is an exploded perspective view showing a main arm rotation part according to the embodiment of the present invention.

FIG. 4 is an exploded perspective view showing the main arm rotation part 300 according to the embodiment of the present invention.

Referring to FIG. 4, the main arm rotation part 300 includes a securing bracket 340, a nut 310, a disc spring 320, a joint bracket 360, a guide plate 370, a tension spring 350, a cam 380, and an arm shaft 390.

The securing bracket 340 is secured to the support plate 10 and thus is fixed in position.

The joint bracket 360 is secured to the first vertical link arm 12 and is rotated in cooperation with rotation of the first vertical link arm 12. The joint bracket 360 has a guide hole 362 formed in an upper portion thereof.

The guide plate 370 is configured to be moved upward and downward in cooperation with rotation of the first vertical link arm 12. The guide plate 370 has a protrusion 374 inserted into the guide hole 362 of the joint bracket 360. The guide plate 370 moves upward and downward within the joint bracket 360.

The tension spring 350 is a coil spring having one side secured to the first vertical link arm 12 and the other side coupled to the guide plate 370 and pulling the guide plate 370 with a predetermined force. The tension spring 350 elastically supports the guide plate 370 with the predetermined force.

The cam 380 is in close contact with a lower horizontal plate 372 of the guide plate 370. The outer peripheral surface of the cam 380 has an elongated round shape, that is, a rounded cam shape as shown in the drawings. The lower horizontal plate 372 of the guide plate 370 is rotated in close contact with the outer peripheral surface of the cam 380.

The guide plate 370 is moved upward and downward with respect to the joint bracket 360 while being rotated along the outer peripheral surface of the cam 380. The guide plate 370 is rotated along the outer circumferential surface of the cam 380 while being elastically supported by the tension spring 350. Thus, even when the first vertical link arm 12 is rotated so as to come into contact with the support plate 10, the first vertical link arm 12 being elastically supported by the tension spring 350 is stably rotated without falling rapidly toward the support plate 10. This is because the guide plate 370 is elastically supported by the tension spring 350 while being rotated along the outer peripheral surface of the cam 380.

The arm shaft 390 is inserted into an insertion hole 382 of the cam 380, a guide insertion hole 376 of the guide plate 370, a center hole 364 of the joint bracket 360, and an insertion hole 342 of the securing bracket 340 whereby the tip of the arm shaft 390 is coupled to the nut 310.

The arm shaft 390 has a circular cross section having a horizontal flat surface formed at upper and lower portions thereof. The insertion hole 382 of the cam 380 and the insertion hole 342 of the securing bracket 340 also have horizontal flat surfaces so as to correspond to the shape of the arm shaft 390. Accordingly, even when the first vertical link arm 12 is rotated with respect to the securing bracket 340, the securing bracket 340, the cam 380, the arm shaft 390, and the nut 310 remain fixed in position and thus are not rotated.

The nut 310 is screwed to the tip of the arm shaft 390. The nut serves to restrict the components into which the arm shaft 390 is inserted from being separated.

The disc spring 320 is interposed between the nut 310 and the securing bracket 340 and serves to elastically support the nut 310.

Washers 330a and 330b are parts which prevent the friction due to rotation as much as possible and thus to enable smooth and efficient rotation.

An insertion ring 335 is a part which is inserted into the guide insertion hole 376 of the guide plate 370 to facilitate upward and downward movement and rotation of the guide plate 370.

The securing bracket 340 has a protruding step 344, and the first vertical link arm 12 has a guide groove 12b formed in a lower portion thereof. In other words, the rotation range of the first vertical link arm 12 is restricted by the protruding step 344 of the securing bracket 340.

Figure 5A:
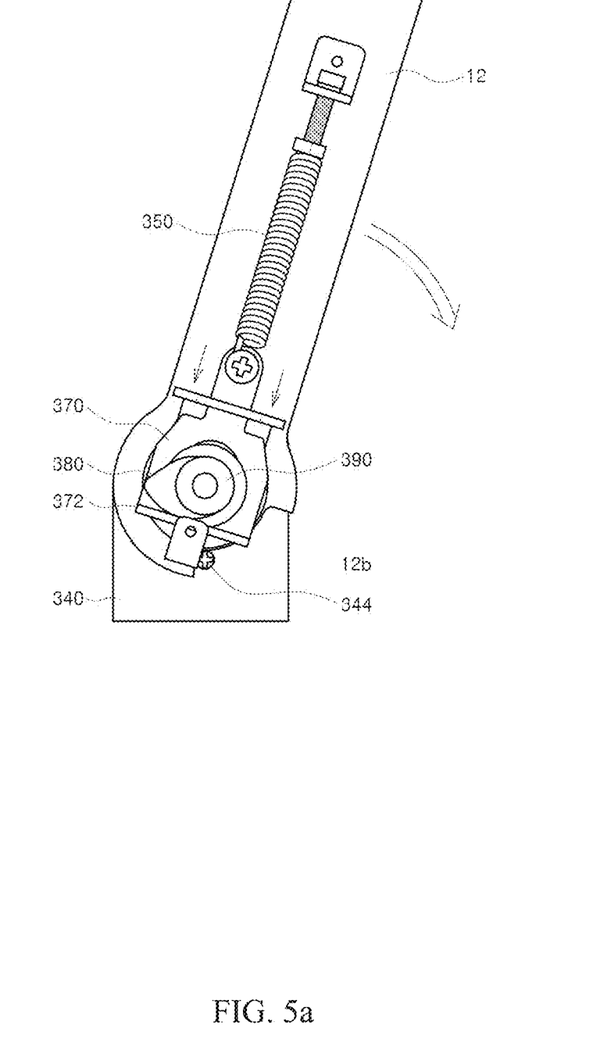
FIGS. 5A and 5B are views showing a principle of up-and-down movement of a guide plate.
Figure 5B:
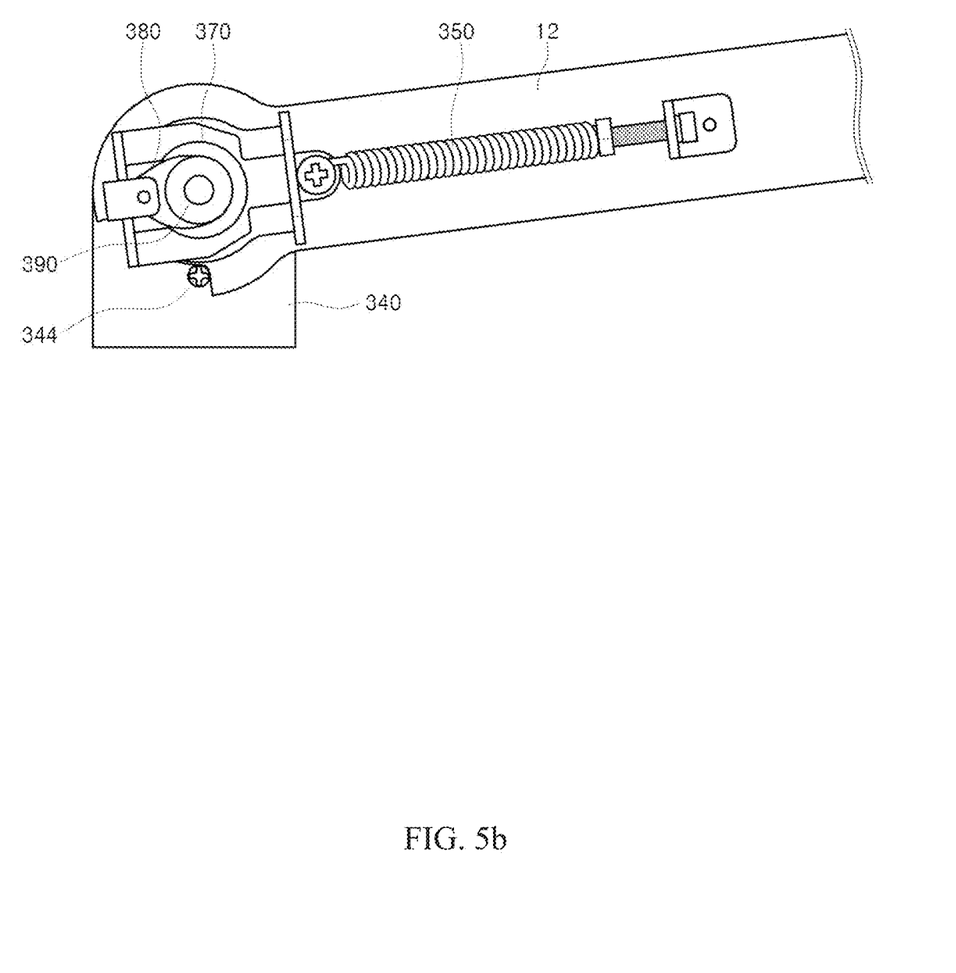

FIGS. 5A and 5B are views showing the principle of upward and downward movement of the guide plate 370, wherein FIG. 5A shows a state where the first vertical link arm 12 is unfolded, and FIG. 5B shows a state where the first vertical link arm 12 is folded.

Referring to FIGS. 5A and 5B, even when the first vertical link arm 12 is rotated in the direction of the arrow, the securing bracket 340 secured to the support plate 10 is not rotated, and the cam 380 fitted over the arm shaft 390 and secured to the securing bracket 340 is not rotated.

On the other hand, when the first vertical link arm 12 is rotated in the direction of the arrow, the joint bracket 360 secured to the first vertical link arm 12 is rotated, and the guide plate 370 having the protrusion 374 inserted in the guide hole 362 of the joint bracket 360 is thus rotated in cooperation with rotation of the joint bracket 360.

In other words, when the first vertical link arm 12 is rotated in the direction of the arrow in the state of FIG. 5A, the lower horizontal plate 372 of the guide plate 370 is moved downward along the outer peripheral surface of the cam 380. In other words, the guide plate 370 is moved downward along the direction of the arrow. Herein, the guide plate 370 is elastically supported by the tension spring 350.

Since the guide plate 370 is elastically supported by the tension spring 370, when the first vertical link arm 12 is folded downward (that is, in the direction of the support plate), the first vertical link arm 12 is slowly folded in a state of being elastically supported without being rotated rapidly. This makes it possible to prevent the magnifier from being damaged due to a collision between the vertical link arm and the support plate that occurs when the vertical link arm is rotated rapidly upon folding and to prevent the user from being injured due to such rapid rotation.

Although embodiments of the present invention have been described for illustrative purposes, those skilled in the art will appreciate that various modifications, additions and substitutions are possible, without changing the spirit or essential features of the present invention. Therefore, the embodiments of the present invention have been described for illustrative purposes, and should not be construed as being restrictive.

What is claimed is:

1. A foldable desktop magnifying device, comprising:
   a support plate entirely supporting an electronic magnifier;
   a horizontal link arm secured to the support plate;
   a first vertical link arm rotatably coupled to the first horizontal link arm;
   a camera supporting part rotatably coupled to the first vertical link arm and having a camera mounted therein;
   a second vertical link arm rotatably coupled to the first vertical link arm; and
   a monitor rotatably secured to the second vertical link arm;
   wherein the first vertical link arm is rotatable with respect to the first horizontal link arm, the second vertical link arm is rotatable with respect to the first vertical link arm, and the monitor is rotatable with respect to the second vertical link arm;
   wherein the monitor is configured to be folded or unfolded.

2. The foldable desktop magnifying device of claim 1, wherein the camera supporting part includes:
   a securing body secured to a first side of the first vertical link arm;
   a body cap coupled to the securing body;
   a cam spring secured to the body cap;
   a cam lever provided at an outside surface of the body cap;
   a camera casing having the camera mounted therein in a secured manner;
   a rotary bracket inserted into the camera casing and being rotatable in cooperation with operation of the cam lever; and
   a cam lever shaft passing through an insertion hole of the cam lever, an insertion hole of the body cap, the cam spring, and an insertion hole of the securing body, whereby a tip of the cam lever shaft is inserted into an insertion hole of the rotary bracket.

3. The foldable desktop magnifying device of claim 2, wherein the cam lever shaft has a semicircular cross section, the insertion hole of the cam lever has a semicircular cross section so as to correspond to a shape of the cam lever shaft, and
   the cam lever shaft is rotatable in cooperation with rotation of the cam lever.

4. The foldable desktop magnifying device of claim 3, wherein the cam lever shaft is inserted into the cam spring, and
   the cam spring has two horizontal lines parallel to each other, the cam spring elastically supports rotation of the cam lever shaft such that the cam lever shaft being rotated is stopped at a predetermined rotation angle.

5. The foldable desktop magnifying device of claim 1, further comprising:
   a main arm rotation part provided at a second side of the first vertical link arm, wherein
   the main arm rotation part includes:
   a securing bracket secured to the support plate;
   a nut provided on a side surface of the securing bracket;
   a joint bracket secured to the first vertical link arm;
   a guide plate inserted into a guide hole formed in an upper portion of the joint bracket and configured to be movable upward and downward;
   a tension spring having one end secured to the first vertical link arm and the other end secured to the guide plate and pulling the guide plate with a predetermined force;
   a cam being in close contact with a lower horizontal plate of the guide plate; and
   an arm shaft passing through the cam, the guide plate, the joint bracket, and the securing bracket, wherein a tip of the arm shaft is coupled to the nut.

6. The foldable desktop magnifying device of claim 5, wherein the arm shaft has a circular cross section having a flat surface formed at upper and lower portions thereof, and an insertion hole of the cam and an insertion hole of the securing bracket have a circular cross section having a flat surface so as to correspond to a shape of the arm shaft.

7. The foldable desktop magnifying device of claim 5, wherein when the first vertical link arm is rotated with respect to the securing bracket, the guide plate is elastically supported by the tension spring, and the lower horizontal plate of the guide plate gets rotated in close contact with an outer peripheral surface of the cam.

8. The foldable desktop magnifying device of claim 5, wherein the securing bracket has a protruding step, and the first vertical link arm has a guide groove formed in a lower portion thereof, whereby a rotation range of the first vertical link arm is restricted by the protruding step of the securing bracket.

* * * * *